US010197423B2

(12) United States Patent
Lindballe

(10) Patent No.: US 10,197,423 B2
(45) Date of Patent: Feb. 5, 2019

(54) ULTRASONIC FLOW METER WITH ELECTRICALLY CONDUCTIVE LAYER AND AN ELECTRODE HAVING A ROUGHENED SURFACE THEREBETWEEN

(71) Applicant: APATOR MIITORS ApS, Aarhus V (DK)

(72) Inventor: Thue Bjerring Lindballe, Sorring (DK)

(73) Assignee: Apator Miitors ApS, Aarhus V (DK)

( * ) Notice: Subject to any disclaimer, the term of this patent is extended or adjusted under 35 U.S.C. 154(b) by 8 days.

(21) Appl. No.: 15/233,590

(22) Filed: Aug. 10, 2016

(65) Prior Publication Data
US 2017/0045387 A1    Feb. 16, 2017

(30) Foreign Application Priority Data

Aug. 10, 2015 (EP) .................................. 15180392

(51) Int. Cl.
| | | |
|---|---|---|
| G01F 1/66 | (2006.01) |
| B06B 1/06 | (2006.01) |
| H01L 41/08 | (2006.01) |
| G01F 15/14 | (2006.01) |
| H01L 41/113 | (2006.01) |
| H01L 41/313 | (2013.01) |
| H01L 41/335 | (2013.01) |

(52) U.S. Cl.
CPC .............. *G01F 1/66* (2013.01); *B06B 1/0644* (2013.01); *G01F 15/14* (2013.01); *H01L 41/0815* (2013.01); *H01L 41/1132* (2013.01); *H01L 41/313* (2013.01); *H01L 41/335* (2013.01)

(58) Field of Classification Search
None
See application file for complete search history.

(56) References Cited

U.S. PATENT DOCUMENTS

| 5,090,252 | A * | 2/1992 | Tschirner | G01F 1/662 73/861.28 |
|---|---|---|---|---|
| 6,604,433 | B1 * | 8/2003 | Azuma | G01F 1/662 73/861.27 |
| 6,739,203 | B1 * | 5/2004 | Feldman | G01F 1/662 73/861.27 |
| 6,822,376 | B2 * | 11/2004 | Baumgartner | B06B 1/06 310/334 |
| 7,262,676 | B2 * | 8/2007 | Ruile | H03H 9/02228 257/E23.011 |
| 2003/0073906 | A1 | 4/2003 | Flesch et al. | |

(Continued)

FOREIGN PATENT DOCUMENTS

WO    2012113401 A1    8/2012

*Primary Examiner* — Harshad R Patel
(74) *Attorney, Agent, or Firm* — Lee & Hayes, P.C.

(57) ABSTRACT

An ultrasonic flow meter comprising two piezoelectric ultrasonic transducers each comprising a first and a second electrode; an ultrasonic flow meter housing, at least a part of which forms a support substrate for supporting the two piezoelectric ultrasonic transducers on an electrically conductive layer of the support substrate; an adhesive applied between the electrically conductive layer and the first electrode; wherein at least the first electrode of each piezoelectric ultrasonic transducer has a roughened surface, and wherein electrical connection between the electrically conductive layer and the first electrode is formed by said roughening.

12 Claims, 9 Drawing Sheets

(56) References Cited

U.S. PATENT DOCUMENTS

| | | |
|---|---|---|
| 2004/0095045 A1 | 5/2004 | Baumgartner |
| 2004/0155557 A1 | 8/2004 | Sawada et al. |
| 2005/0046312 A1* | 3/2005 | Miyoshi .............. H01L 41/0477 310/366 |
| 2007/0257580 A1* | 11/2007 | Chen ........................ B41J 2/161 310/328 |
| 2009/0015104 A1* | 1/2009 | Kimura ................. B06B 1/0618 310/334 |
| 2010/0156244 A1 | 6/2010 | Lukacs et al. |
| 2012/0319535 A1* | 12/2012 | Dausch ................. B06B 1/0622 310/365 |
| 2013/0085396 A1* | 4/2013 | Isono .................... A61B 8/4455 600/472 |
| 2013/0327155 A1* | 12/2013 | Drachmann ............ G01F 1/662 73/861.18 |
| 2015/0211905 A1* | 7/2015 | Drachmann ............ G01F 1/662 73/861.28 |
| 2015/0219482 A1 | 8/2015 | Drachmann |

* cited by examiner

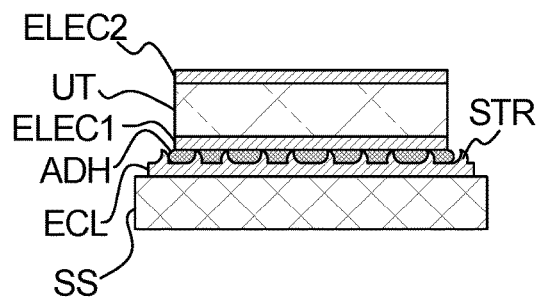
Fig. 2
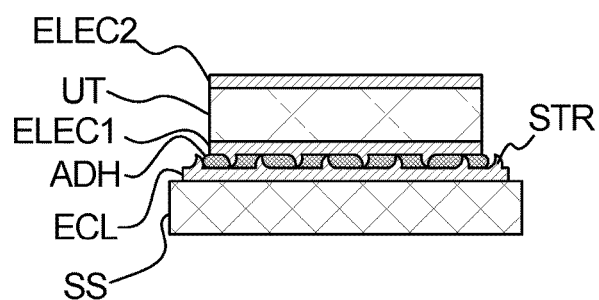
Fig. 3
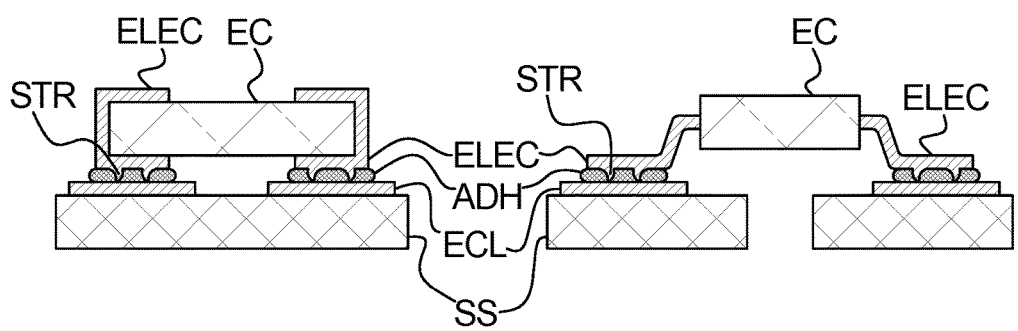
Fig. 4                                    Fig. 5

ULTRASONIC FLOW METER WITH ELECTRICALLY CONDUCTIVE LAYER AND AN ELECTRODE HAVING A ROUGHENED SURFACE THEREBETWEEN

FIELD OF THE INVENTION

The present invention relates to a method of bonding an electrode of a piezoelectric ultrasonic transducer to an electrically conductive layer of a support substrate, an assembly of a support substrate and a piezoelectric ultrasonic transducer, an ultrasonic flow meter, a method of bonding an electrode of an electronic component to an electrically conductive layer of a support substrate, an assembly of a support substrate and an electronic component, or a surface mount technology assembly system.

BACKGROUND OF THE INVENTION

When constructing compact ultrasonic flow meters, it may often be a challenge to implement smaller transducers. Especially fixation of such transducer may often be a problem, e.g. due to the size. Moreover, common challenged for ultrasonic flow meters include battery lifetime and keeping the costs of the ultrasonic flow meters at a reasonable level.

Thus, it is an object of the invention to solve the above mentioned problem.

SUMMARY OF THE INVENTION

The invention relates to a method of bonding an electrode of a piezoelectric ultrasonic transducer to an electrically conductive layer of a support substrate to support the piezoelectric ultrasonic transducer and establish an electrical connection between the electrode and the electrically conductive layer;

the method comprising:
roughening the surface of one or both of the electrode and the electrically conductive layer;
applying an adhesive to one or both of the electrode and the electrically conductive layer;
assembling the electrode and the electrically conductive layer; and
curing the adhesive.

One very important advantage of the invention may be that a relatively cheap solution may be provided having relatively low power consumption. A low power consumption may be especially advantageous when manufacturing battery powered apparatuses, such as ultrasonic flow meters. The low power consumption and low cost solution may be facilitated by the fact that relatively small piezoelectric ultrasonic transducers may be used, i.e. piezoelectric ultrasonic transducers having a relatively small diameter. The present inventor has realized that such small piezoelectric ultrasonic transducer, which may often be difficult to implement especially in commercially viable products, may in fact be implemented e.g. due to the fact that the use of wrap-around electrodes may be avoided. The use of wrap-around electrodes is relatively common in order to establish electrical contact to a hidden or obscured electrode of a piezoelectric ultrasonic transducer, which is typically hidden or obscured in order to bond it effectively to a support substrate so as to establish a durably mechanical fixation as well as an effective acoustic coupling to the support substrate. Wrap-around electrodes are less suitable for smaller piezoelectric ultrasonic transducer. However, by providing a solution for establishing electrical contact via an electrically conductive layer on the support substrate and via roughening the surface of one or both of the electrode and the electrically conductive layer, the use of wrap around electrodes may be avoided and smaller piezoelectric ultrasonic transducers, which are cheaper and more power effective, may be implemented.

One very significant advantage of the invention may be that a relatively strong an endurable bonding between said electrode and said electrically bonding layer is established giving mechanical fixation as well as a relatively effective acoustic coupling while also, at the same time, establishing electrical contact between said electrode and said electrically bonding layer. Moreover, this is established at the same time, whereby further steps for establishing all of mechanical fixation, acoustic coupling, and electrical contact may be avoided.

A further advantage of the invention may be that the above advantage may be obtained while using piezoelectric ultrasonic transducers e.g. formed as substantially circular disks with electrodes on each side. Thereby, piezoelectric ultrasonic transducers with wrap-around electrodes may be avoided. Piezoelectric ultrasonic transducers with wrap-around electrodes may be more expensive compared with piezoelectric ultrasonic transducers with electrodes confined within the two, opposite sides. Thus, a more cost-effective solution is provided.

Also, in some cases the use of wrap-around electrodes may lead to some extinguishing or even distortion of the ultrasound signal which may in turn reduce the accuracy of the piezoelectric ultrasonic transducer and the apparatus in which it is installed, such as a piezoelectric ultrasonic transducer. The problem with wrap-around electrode induced extinguishing or distortion may be especially large when using relatively small piezoelectric ultrasonic transducers, e.g. in compact ultrasonic flow meter applications. Thus, one advantage of the invention may be that a more accurate piezoelectric ultrasonic transducer may be utilized thus facilitating compact solutions.

One further advantage of the invention may be that the use of conductive adhesive or adhesive comprising conductive particles may not be necessary, and may thus be avoided if advantageous. For many applications it may be advantageous to avoid conductive adhesive, for example due to short unintentional electrical connections formed by excess adhesive, leading to e.g. short circuiting or other errors. Another advantage of avoiding conductive adhesive may be that unmodified non-conductive adhesive may be used instead and that for example inferior mechanical fixation caused e.g. by premature curing due to conductive particles may be avoided. Still a further advantage of not having to use conductive adhesive may be that such adhesive may be relatively expensive, when comparing to non-conductive adhesive. This advantage may be obtained while still ensuring electrical connection. One further advantage may be that by using unmodified non-conductive adhesive, the strength of the bonding may have a higher degree of predictability, at least compared to conductive adhesive made by mixing of conductive particles with non-conductive adhesive. This advantage may be obtained while still ensuring electrical connection.

One further significant advantage of the invention may be that electrical connection to the electrode which may typically become obscured, i.e. hidden, when bonding it to the electrically conductive layer, is established in a relatively simple and easy manner.

Still a further advantage of the invention may be that the piezoelectric ultrasonic transducer and any device in which it is used, such as an ultrasonic flow meter, may endure higher temperatures, such as up to 90 degrees Celsius or even 120 degrees Celsius, or higher, without failure of e.g. the bonding of the piezoelectric ultrasonic transducer on the electrically conductive layer.

In the context of the present invention the term "roughening" is intended to mean a process performed whereby roughness is induced or made on the surface. The surfaces roughness includes surfaces structures, arranged in a fully or partly in a pattern or arranged fully or partly random on the surface. The surface structures includes elevated structures which may be peaks, such as non-rigid spikes, undetached chips, or ridges, such as line-formed ridges. I.e. the roughness implies e.g. points, bristles, ridges or combinations thereof. Typically, the roughness or its surfaces structures may be characterized by having a roughness arithmetic average Ra between 1 and 500 micrometer, more preferably between 2 and 100 micrometer, most preferably between 3 and 50 micrometer and/or by having a roughness mean peak spacing RSm between 1 and 1000 micrometer, more preferably between 5 and 500 micrometer, most preferably between 10 and 100 micrometer. Particularly, the term "roughening" may be understood as processing a surface, which may be relatively smooth into a surface which is less smooth, i.e. more rough; i.e. increasing the roughness of the surface.

It should be noted that typically any surface roughness on the electrode may have a characteristic size below the thickness of the electrode. Also, it should be noted that some parameters may in some cases be better for describing certain kinds of surface roughness, e.g. manufactured by a specified method, but not always any other kinds of surface roughness. It should be noted that in many cases, the roughness arithmetic average Ra may be especially suitable for describing roughness made by means of electric discharge machining and abrasion by e.g. sand paper, whereas the roughness mean spacing RSm may be especially suited for surface roughness made by laser ablation.

Moreover, when very large peaks are made, such that for example only 20 or even fewer surface peaks are needed to establish sufficient electrical contact, a relatively large roughness mean spacing RSm may suffice. This may be the case for some laser ablation based embodiments. Correspondingly, when relatively small surface structures are made, the best results may in many cases be obtained when having a relatively small roughness mean spacing RSm. This may be the case e.g. for some sand paper abrasive based embodiments.

In the context of the present invention the term "piezoelectric ultrasonic transducer" should be understood as a transducer comprising a piezoelectric element, which can emit ultrasound and which preferably is adapted for use in ultrasonic flow meters.

In the context of the present invention the term "curing" is meant the process where the adhesive goes from its initial state into a bonding state, a process which may include chemical reactions e.g. between different components in the adhesive and/or with other substances, such as substances in the air and/or on the electrically conductive layer and/or the electrode; or physical transformations such as evaporation of one or more solvents.

According to an advantageous embodiment of the invention said surface(s) of one or both of the electrode and the electrically conductive layer is/are substantially flat.

Typically, in order to transmit an ultrasound signal from the piezoelectric ultrasonic transducer and through the support substrate, the piezoelectric ultrasonic transducer needs to have a sufficiently effective acoustic coupling to the support substrate. To facilitate this, the electrically conductive layer as well as the piezoelectric ultrasonic transducer may typically be formed so that their contact surfaces for contacting each other are substantially flat, i.e. without e.g. any long distance curvature.

According to an embodiment of the invention said surface (s) of one or both of the electrode and the electrically conductive layer is/are substantially smooth before said roughening.

According to an advantageous embodiment of the invention the adhesive is an electrically non-conductive adhesive.

Typically, a relatively small distance between the electrode of the piezoelectric ultrasonic transducer and the electrically conductive layer of the support substrate may be preferred, e.g. to establish an effective acoustic coupling and to ensure mechanical fixation between the two. Thus, since an excess amount of adhesive may often be used in practice in order to ensure bonding, the excess amount of adhesive often aggregates around at least part of the bonded piezoelectric ultrasonic transducer after bonding. Since the excessive adhesive may often touch different electronic components and/or connectors thereto, it may form unintended electrical connections, which may e.g. result in short circuiting. However, by using a non-conductive adhesive, this problem may be avoided while at the same time ensuring electrical connected due to the performed roughening.

According to an advantageous embodiment of the invention a layer of the adhesive having a thickness of at least 50 micrometers is electrically non-conductive, such as at least 20 micrometers, such as at least 5 micrometers, such as at least 1 micrometers.

In the present context it should be understood that the above mentioned thickness of the adhesive is after said step of assembling, preferably also after said step of curing.

According to an advantageous embodiment of the invention the adhesive is characterized by an electrical resistivity of more than 1 $\Omega \cdot m$ at 20° C., such as more than $10^5$ $\Omega \cdot m$, such as more than $10^7$ $\Omega \cdot m$, such as more than $10^9$ $\Omega \cdot m$, such as more than $10^{11}$ $\Omega \cdot m$.

According to an embodiment of the invention, the electrical resistance of the assembling interface formed between the electrode and the electrically conductive layer is less than $10\Omega$, such as less than $1\Omega$, such as less than $0.1\Omega$.

According to an advantageous embodiment of the invention the adhesive contains less than 10% by volume of electrically conductive particles, such as less than 5% by volume, such as less than 1% by volume.

One way of making an adhesive conductive may be by including a sufficiently high amount of conductive particles, e.g. conductive metal particles. However, mixing an adhesive with conductive particles may weaken the adhesive and formed bonds made using such adhesive, e.g. due to premature curing of the adhesive. Thus, when a strong bonding is needed and/or a non-conductive adhesive is preferred, the content of electrically conductive particles may be reduced, possibly even to trace amounts or lower.

According to an advantageous embodiment of the invention the adhesive is a semi-rigid adhesive.

Typical preferred adhesives include for example polyurethane, epoxy or acrylic based adhesive, although other types of adhesives may also be used for many purposes.

According to an embodiment of the invention, the adhesive is characterized by having a tensile modulus of between 200 and 1000 N/mm² (Newton per square millimeter).

According to an embodiment of the invention, the adhesive is characterized by having an elongation at break of between 1% and 200%, such as between 2% and 150%, such as between 120% and 140% or between 130% and 140%, or such as between 1% and 20%, such as between 2% and 10%.

According to an advantageous embodiment of the invention the adhesive is curable at ambient temperatures between 10° C. and 80° C., more preferably between 18° C. and 40° C., such as at 20° C.

According to an embodiment of the invention, the adhesive is a moisture cure or condensation cure adhesive.

According to an embodiment of the invention, said curing the adhesive (ADH) comprises leaving the assembled electrode (ELEC) and electrically conductive layer (ECL) at rest for a pre-defined number of hours with an ambient temperature between 0 and 120° C., such as 10° C. and 80° C., preferably between 18° C. and 40° C.

On advantage of the above embodiment may be that the adhesive may be cured under ambient or near-ambient conditions.

According to an embodiment of the invention, the pre-defined number of hours is between 0.1 and 48 hours, more preferably between 0.2 and 12 hours, and most preferably between 0.5 and 4 hours.

According to an advantageous embodiment of the invention said roughening increases the roughness of the surface the electrode and/or the electrically conductive layer.

It should be understood that although surfaces of most practically used electronic components including piezoelectric ultrasonic transducers may have some small-scale roughness, such roughness does not influence the conductivity between an electrode and an electrically conductive layer spaced apart by e.g. several micrometers of non-conductive adhesive. However, by increasing the roughness significantly, e.g. by creating or forming surface structures such as peaks or ridges, the electrically non-conductive gap of the adhesive may be bridged to a sufficient degree to ensure effective electrical conduction between the electrode and the electrically conductive layer for the purpose of transmission and reception of ultrasound signal by the piezoelectric ultrasonic transducer.

According to an advantageous embodiment of the invention said roughening of said electrode is performed as post-processing on said electrode of said piezoelectric ultrasonic transducer.

In some embodiments, the post-processing is done after manufacturing of the piezoelectric ultrasonic transducer, either immediately after manufacturing by the manufacturer, or be done in connection with the bonding of the electrode of the piezoelectric ultrasonic transducer to the electrically conductive layer of the support substrate.

According to an advantageous embodiment of the invention said roughening the electrode is performed during and/or before manufacture of said piezoelectric ultrasonic transducer.

For example, if the surface of the piezoelectric ultrasonic transducer is roughened before application of the electrode on that surface, the electrode may also have a roughened surface, at least to some degree, provided that the electrode is sufficiently thin.

According to an advantageous embodiment of the invention said roughening the electrically conductive layer is performed during and/or before manufacture of the electrically conductive layer.

For example, if the surface of the support substrate is roughened before application of the electrically conductive layer on that surface, the electrically conductive layer may also have a roughened surface, at least to some degree, provided that the electrically conductive layer is sufficiently thin.

According to an embodiment, one way of roughening the surface of the support substrate is by forming the support substrate by molding in a mold having a roughened surface in positions of the mold corresponding to positions of the support substrate where the support substrate is intended to have a roughened surface. Then the surface of the support substrate will, at least to some degree, inherit the roughened characteristics of the mold, and, in turn, transfer the roughenings or surface structure to the electrically conductive layer.

According to an advantageous embodiment of the invention the roughening of the electrically conductive layer is performed by applying the electrically conductive layer to a roughened surface of the support substrate.

According to an advantageous embodiment of the invention the roughening of the electrically conductive layer is performed after application of the electrically conductive layer to the support substrate.

According to an advantageous embodiment of the invention the roughening of one or both of the electrode and the electrically conductive layer is performed by sand blasting or rasping or sanding with an abrasive, e.g. sand paper.

It should be understood that rasping with an abrasive such as sand paper may involve rasping in one linear direction, or rasping in a circular pattern, or even rasping in more complex and/or random patterns.

Moreover, it should be understood that the sand blasting or rasping or sanding with an abrasive, e.g. sand paper, may be applied on the electrode and/or the electrically conductive layer directly, or to the support substrate on which the electrically conductive layer is applied.

According to an advantageous embodiment of the invention the roughening of one or both of the electrode and the electrically conductive layer is performed by laser ablation.

Moreover, it should be understood that the laser ablation may be applied on the electrode and/or the electrically conductive layer directly, or to the support substrate on which the electrically conductive layer is applied.

According to an advantageous embodiment of the invention the roughening of one or both of the electrode and the electrically conductive layer is performed by electrical discharge machining.

Moreover, it should be understood that the electrical discharge machining may be applied on the electrode and/or the electrically conductive layer directly, or to the support substrate on which the electrically conductive layer is applied.

According to an advantageous embodiment of the invention the roughening comprises forming elevated surface structures such as flexible peaks or ridges, e.g. non-rigid spikes, undetached chips or grind marks, on a surface.

In the present context it should be understood that the elevated surface structures may be organized partly of fully into a certain pattern, or may be partially or fully randomized in size, dimensions, distances, etc. Typically even randomized surface structures may be characterized by statistical parameters; such as for example average size or average characteristic distances between surface structures.

According to an advantageous embodiment of the invention the roughening comprises creating a roughened surface with a roughness arithmetic average Ra between 1 and 500 micrometer, more preferably between 2 and 100 micrometer, most preferably between 3 and 50 micrometer.

The roughness arithmetic average Ra may be determined e.g. by x-ray imaging, such as three dimensional x-ray imaging.

According to an advantageous embodiment of the invention the roughening comprises creating an uneven surface with a roughness mean peak spacing RSm between 1 and 1000 micrometer, more preferably between 5 and 500 micrometer, most preferably between 10 and 100 micrometer.

The roughness mean peak spacing RSm may be determined e.g. by x-ray imaging, such as three dimensional x-ray imaging.

According to an advantageous embodiment of the invention said roughening forms surface structures with dimensions to allow electrical conduction between the electrode and the electrically conductive layer after assembly and curing.

Said surface structures may include peaks and/or ridges, or other forms of elevated features on the roughened surface (s). The important thing is that a sufficient amount of the surfaces structures can act as electrical contact points and thus establish electrical connection between the electrode and the electrically conductive layer. Thus, the surface structures may be seen as elevated electrical contact points.

According to an embodiment of the invention, the assembled electrode and electrically conductive layer forms an assembling interface having elastic properties partly from the adhesive and partly from surface structures made by the roughening, and wherein the adhesive is chosen and the roughening is performed to ensure elastic properties of the assembly interface in the direction orthogonal to said assembly interface is dominated by the adhesive.

According to an advantageous embodiment of the invention the ratio between the conductive area and the non-conductive area is less than 1:100, such as less than 1:200.

According to an advantageous embodiment of the invention the assembling the electrode and the electrically conductive layer comprises approaching the electrode and the electrically conductive layer to each other until a distance between an average surface of said electrode and an average surface of said electrically conductive layer is between 1 and 500 micrometer, more preferably between 2 and 100 micrometer, most preferably between 3 and 50 micrometer.

According to an embodiment of the invention, said electrode has a substantially flat surface.

In the context of the above embodiment, it should be understood that the electrode has a substantially flat surface, i.e. a surface which is substantially without curvature, before roughening, if any, of said electrode.

According to an embodiment of the invention, the piezoelectric ultrasonic transducer comprises a piezoelectric disk.

According to an embodiment of the invention, the piezoelectric disk comprises electrodes on opposite flat sides of the disk.

According to an advantageous embodiment of the invention said electrode is a first electrode and said piezoelectric ultrasonic transducer further comprises a second electrode.

According to an advantageous embodiment of the invention said first and second electrodes are located on opposite sides of said piezoelectric ultrasonic transducer.

Preferably, neither of the first and second electrodes extends beyond the side on which they each are applied.

According to an advantageous embodiment of the invention said piezoelectric ultrasonic transducer comprises a first and a second surface, the first and second being opposite and substantially flat, the first and second surfaces being connected via one or more sides, wherein said first electrode extends over a part of or all of the first surface.

Many piezoelectric ultrasonic transducers have substantially circular first and second surfaces, these surfaces being connected by a single curved side. Some piezoelectric ultrasonic transducers may, however, have polygonal shaped first and second surfaces, and a corresponding number of sides connecting the first and second surfaces.

According to an advantageous embodiment of the invention said first electrode does not extend onto said second surface.

According to an embodiment of the invention, said first electrode does not extend onto said second surface, and said second electrode does not extend onto said first surface.

According to an advantageous embodiment of the invention said first electrode does not extend onto said one or more sides.

According to an embodiment of the invention said first electrode does not extend onto said one or more sides, and said second electrode does not extend onto said one or more sides.

According to an advantageous embodiment of the invention the piezoelectric ultrasonic transducer is characterized by having one obscured electrode and one accessible electrode after the assembling the electrode and the electrically conductive layer.

Thus, according to the above embodiment said electrode is obscured after bonding to said electrically conductive layer. Thus, since the electrode is obscured, i.e. hidden, after being bonded to the electrically conductive layer of the supporting substrate, it would typically be a challenge to establish electrical contact to the electrode after fixating the piezoelectric ultrasonic transducer to a support substrate. However, since electrical contact typically extends over a wider area and therefore typically may be readily accessible, electrical contact to the obscured electrode may easily be established via electrical contact to the electrically conductive layer, since electrical connection is, according to the invention, established between the electrode and the electrically conductive layer.

According to an advantageous embodiment of the invention piezoelectric ultrasonic transducer comprises a piezoelectric disk having a thickness between 0.25 and 10 millimeters, and having a diameter of between 4 and 25 millimeters.

According to an embodiment of the invention, said electrode of said piezoelectric ultrasonic transducer comprises or is made from a material selected from the list consisting of Silver, Gold, Cupper-Nickel alloy, and combinations thereof.

According to an embodiment of the invention, said electrode of said piezoelectric ultrasonic transducer comprises or is made from silver.

According to an advantageous embodiment of the invention electrically conductive layer extends beyond the bonding interface between the electrode and the electrically conductive layer.

Thus, the electrically conductive layer extends beyond the bonding interface between the electrode and the electrically conductive layer when the electrode and the electrically conductive layer have been bonded together.

According to an embodiment of the invention, the support substrate is an electrically conductive material and forms said electrically conductive layer.

According to an advantageous embodiment of the invention the support substrate is formed by a non-conductive material.

According to an embodiment of the invention, the support substrate is formed by a non-conductive material with said electrically conductive layer applied thereto.

According to an advantageous embodiment of the invention the support substrate forms part of an ultrasonic transducer housing.

According to an embodiment of the invention, the support substrate forms part of an ultrasonic flow meter housing, preferably an ultrasonic cold water meter housing.

According to an embodiment of the invention, the electrically conductive layer comprises an electrically conductive track.

According to an embodiment of the invention, the electrically conductive layer comprises a pad at a location of said assembling the electrode and the electrically conductive layer.

According to an embodiment of the invention, said roughening said electrically conductive layer comprises roughening said pad and/or said electrically conductive track.

According to an embodiment of the invention, said roughening said pad comprises roughening said pad prior to applying it to said electrically conductive layer.

According to an embodiment of the invention, said support substrate and/or said electrically conductive layer has a substantially flat surface.

In the context of the above embodiment, it should be understood that the support substrate and/or the electrically conductive layer has a substantially flat surface, i.e. a surface which is substantially without curvature or long-range structures, before roughening, if any, of said support substrate and/or the electrically conductive layer.

According to an advantageous embodiment of the invention said method comprises
providing an ultrasonic transducer housing for an ultrasonic flow meter, the ultrasonic transducer housing being formed by electrically non-conductive material and said support substrate forming one or more support surfaces for one or more piezoelectric ultrasonic transducers and the one or more support surfaces being at least partly covered by one or more of said electrically conductive layers;
performing said assembling, subsequently to said roughening and applying an adhesive, by placing each of said one or more piezoelectric ultrasonic transducers on said one or more support surfaces so that a first electrode of each of the one or more piezoelectric ultrasonic transducers is placed as said electrode on said electrically conductive layer.

According to an embodiment of the invention, said one or more piezoelectric ultrasonic transducers each comprises a piezoelectric disk.

According to an advantageous embodiment of the invention said method comprises establishing a connection from an electronic circuit of said ultrasonic flow meter to said first electrode via said electrically conductive layer.

According to an advantageous embodiment of the invention said method comprises establishing a connection from the electronic circuit of the ultrasonic flow meter to a second electrode of each of the one or more piezoelectric ultrasonic transducers by means of a wire and/or a spring.

Thus, according to the above embodiment, the electronic circuit may be adapted and arranged to control and operate part of or all of the ultrasonic flow meter, including for example transmission and reception of ultrasonic signals, calculations performed at least partly on the basis of the transmitted and/or received ultrasonic signals, storing of measurements and/or calculations made at least partly on the basis thereof, transmission of measurements and/or calculations made at least partly on the basis thereof to external receivers, displaying measurements and/or calculations made at least partly on the basis thereof via a display, etc.

The invention further relates to an assembly of a support substrate and a piezoelectric ultrasonic transducer, the assembly comprising:
the support substrate having an electrically conductive layer;
the piezoelectric ultrasonic transducer having an electrode; and
an adhesive applied between said electrically conductive layer and said electrode;
wherein one or both of said electrically conductive layer and said electrode has a roughened surface.

According to an advantageous embodiment of the invention a distance between an average surface of said electrode and an average surface of said electrically conductive layer is between 1 and 500 micrometer, more preferably between 2 and 100 micrometer, most preferably between 3 and 50 micrometer.

According to an advantageous embodiment of the invention said assembly forms part of an ultrasonic flow meter, preferably an ultrasonic cold water meter, the support substrate forming one or more support surfaces for one or more piezoelectric ultrasonic transducers; said electrode comprising a first electrode of said piezoelectric ultrasonic transducers.

According to an advantageous embodiment of the invention said electrode of said piezoelectric ultrasonic transducer is bonded to said electrically conductive layer of said support substrate by a method according to the invention or any embodiments thereof.

The invention furthermore relates to an ultrasonic flow meter comprising:
two piezoelectric ultrasonic transducers each comprising a first and second electrode;
an ultrasonic flow meter housing, at least a part of which forms a support substrate for supporting said two piezoelectric ultrasonic transducers on an electrically conductive layer of the support substrate;
an adhesive applied between said electrically conductive layer and said first electrode;
wherein one or both of said electrically conductive layer and said first electrode of each piezoelectric ultrasonic transducer has a roughened surface.

In the present context it should be understood that said support substrate supports both of said two piezoelectric ultrasonic transducers, i.e. that the support substrate is a common support substrate for the two piezoelectric ultrasonic transducers. In other words, the support substrate supporting the two piezoelectric ultrasonic transducers is formed as a single monolithic piece. It should also be understood that a part of the housing form the support substrate. For example if the housing is made up by a housing cup and a housing lid, the housing cup forms the support substrate. Furthermore, it should be understood that for each of the piezoelectric ultrasonic transducers, one or both of said electrically conductive layer and said first electrode has a roughened surface, i.e. a surface, which has been roughened.

The invention furthermore relates to an ultrasonic flow meter comprising:

a piezoelectric ultrasonic transducer comprising a first and second electrode;

an ultrasonic transducer housing forming a support substrate for supporting said piezoelectric ultrasonic transducer on an electrically conductive layer of the support substrate;

an adhesive applied between said electrically conductive layer and said first electrode;

wherein one or both of said electrically conductive layer and said first electrode has a roughened surface.

According to an advantageous embodiment of the invention said ultrasonic flow meter further comprises an electronic circuit, and wherein said electronic circuit is electrically connected to said first electrode via said electrically conductive layer and said electronic circuit is further electrically connected to said second electrode.

Thus, according to the above embodiment, the ultrasonic flow meter comprises an electronic circuit which may be adapted and arranged to control and operate part of or all of the ultrasonic flow meter, including for example transmission and reception of ultrasonic signals, calculations performed at least partly on the basis of the transmitted and/or received ultrasonic signals, storing of measurements and/or calculations made at least partly on the basis thereof, transmission of measurements and/or calculations made at least partly on the basis thereof to external receivers, displaying measurements and/or calculations made at least partly on the basis thereof via a display, etc.

According to an embodiment of the invention, the ultrasonic flow meter is a transit time ultrasonic flow meter.

According to an advantageous embodiment of the invention said ultrasonic flow meter further comprises an additional piezoelectric ultrasonic transducer also supported by said support substrate on the same or a separate electrically conductive layer as said piezoelectric ultrasonic transducer.

According to an advantageous embodiment of the invention said ultrasonic flow meter is an ultrasonic cold water meter with a temperature class of T130 or lower, preferably T90 or lower.

The invention furthermore relates to a method of bonding an electrode of an electronic component, such as a piezoelectric ultrasonic transducer, to an electrically conductive layer of a support substrate to support the electronic component and establish an electrical connection between the electrode and the electrically conductive layer;

the method comprising:
roughening the surface of one or both of the electrode and the electrically conductive layer;
applying an adhesive to one or both of the electrode and the electrically conductive layer;
assembling the electrode and the electrically conductive layer; and
curing the adhesive.

According to an advantageous embodiment of the invention, the method above is performed according to the first mentioned method of the invention, or any embodiment thereof.

The invention furthermore relates to an assembly of a support substrate and an electronic component, such as a piezoelectric ultrasonic transducer, the assembly comprising:

the support substrate having an electrically conductive layer;

the electronic component having an electrode; and an adhesive applied between said electrically conductive layer and said electrode;

wherein one or both of said electrically conductive layer and said electrode has a roughened surface.

According to an advantageous embodiment of the invention the assembly above is according to the first mentioned assembly of the invention or any embodiment thereof, wherein optionally the electrode is bonded to the electrically conductive layer according to the method according to the invention or any embodiment thereof.

The invention furthermore relates to a surface mount technology assembly system comprising a printed circuit board solder pad surface roughener for roughening locations of the printed circuit board where electrodes of electronic components are intended to be placed;

an adhesive application unit for applying an adhesive to said roughened locations of the printed circuit board; and a component placement system for picking surface mount devices, SMD, and placing them on the printed circuit board with electrodes of the surface mount devices being placed on said roughened locations.

According to an advantageous embodiment of the invention the surface mount technology assembly system above is adapted to bond the electrodes of the electronic components to electrically conducive layers on the printed circuit boards according to any method of the invention or embodiments thereof.

According to an advantageous embodiment of the invention the method according to the invention or any of its embodiments, the assembly according to the invention or any of its embodiments, or the surface mount technology assembly system according to the invention or any of its embodiments comprises an electronic component which is a surface mounted device, SMD.

According to an advantageous embodiment of the invention the method according to the invention or any of its embodiments, the assembly according to the invention or any of its embodiments, or the surface mount technology assembly system according to the invention or any of its embodiments comprises an assembly being a surface mount assembly, SMA.

According to an advantageous embodiment of the invention the method according to the invention or any of its embodiments, the assembly according to the invention or any of its embodiments, or the surface mount technology assembly system according to the invention or any of its embodiments comprises a support substrate being a printed circuit board, PCB.

BRIEF DESCRIPTION OF THE DRAWINGS

The invention will in the following be described with reference to the drawings where FIG. 2 illustrates a piezoelectric ultrasonic transducer UT bonded to an electrically conductive layer ECL of a support substrate SS according to an embodiment of the invention, FIG. 3 illustrates a piezoelectric ultrasonic transducer UT bonded to an electrically conductive layer ECL of a support substrate SS according to an embodiment of the invention, FIG. 4 illustrates an electronic component EC bonded to an electrically conductive layer ECL of a support substrate SS according to an embodiment of the invention, FIG. 5 illustrates an electronic component EC bonded to an electrically conductive layer ECL of a support substrate SS according to an embodiment of the invention.

DETAILED DESCRIPTION OF THE INVENTION

Figure 1A:
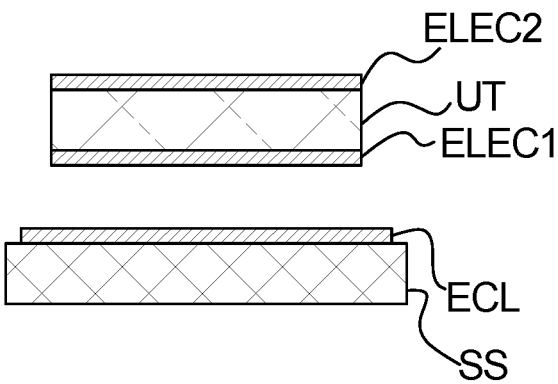
FIGS. 1A-C illustrate a method of bonding a piezoelectric ultrasonic transducer UT to an electrically conductive layer ECL of a support substrate SS according to an embodiment of the invention.
Figure 1B:
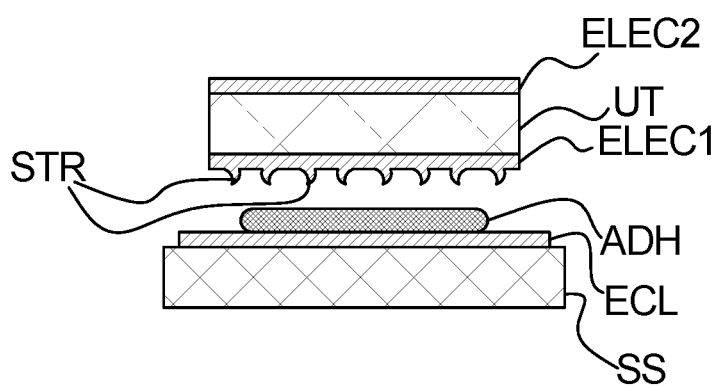
Figure 1C:
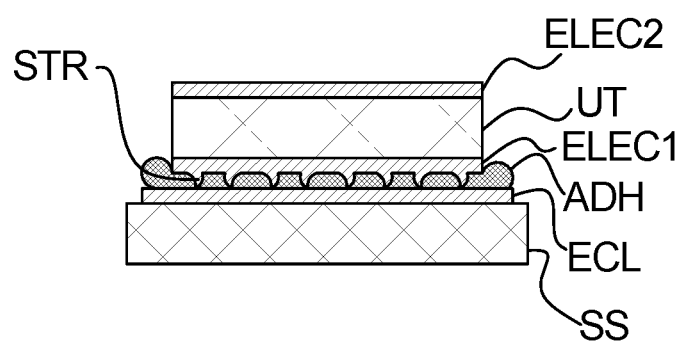

FIGS. 1A-C illustrate a method of bonding a piezoelectric ultrasonic transducer to an electrically conductive layer ECL of a support substrate SS according to an embodiment of the invention.

First, the piezoelectric ultrasonic transducer UT is provided, as illustrated in FIG. 1. The piezoelectric ultrasonic transducer UT comprises a electrode shown as the lower electrode as a first electrode ELEC1, and further comprises a second electrode ELEC2 shown as the upper electrode The first and second electrodes ELEC1, ELEC2 are positioned on opposite sides of the ultrasonic transducer UT. As illustrated on FIG. 1A, the electrodes ELEC1, ELEC2 are substantially flat and smooth, i.e. without any surface roughness or structures. The piezoelectric ultrasonic transducer UT may for example comprise a piezoelectric disk. This is described in relation to other embodiments, as described below.

The support substrate SS comprises an electrically conductive layer ECL, as also illustrated on FIG. 1A. The support substrate SS and the electrically conductive layer ECL may be substantially flat, as illustrated on FIG. 1A.

The electrically conductive layer ECL is in FIG. 1A shown as a layer applied to the support substrate SS, but in other embodiments the support substrate SS may be conductive so as to form the electrically conductive layer ECL.

Then, the first electrode ELEC1 shown in FIG. 1A as the bottom electrode ELEC1 is roughened to obtain an electrode ELEC1 having a roughened surface as shown in FIG. 1B. The roughening creates or induces surface structures STR in the first electrode ELEC1, as illustrated in FIG. 1B. The surface structures STR may comprise peaks, and/or surface structures other than peaks, e.g. ridges, depending on the specific method of roughening. Alternatively, or in combination therewith, the electrically conductive layer ECL may be roughened. This is illustrated in FIGS. 2 and 3, respectively.

An adhesive ADH is applied to the electrically conductive layer ECL. In certain alternative embodiments, the adhesive ADH is applied to the first electrode ELEC1 instead of or in combination with being applied to the electrically conductive layer ECL.

Finally, the first electrode ELEC1 and the electrically conductive layer ECL are assembled and the adhesive ADH is cured to obtain a bonded piezoelectric ultrasonic transducer UT on the electrically conductive layer ECL of the support substrate SS. The piezoelectric ultrasonic transducer UT is illustrated in FIG. 1C.

As shown in FIG. 1C, electrical connection is established between the first electrode ELEC1 and the electrically conductive layer ECL due to a number of surface structures STR made by the roughening.

Also, as illustrated in FIG. 1C, the piezoelectric ultrasonic transducer UT is supported on the electrically conductive layer ECL of the support substrate SS.

As can be seen on FIG. 1C, a certain amount of excess adhesive ADH has been pushed out from the space between the ultrasonic transducer UT and the electrically conductive layer ECL. In order for the excess adhesive ADH not to make unintended electrical contact, the adhesive ADH may preferably be electrically non-conductive. This may be especially advantageous when the amount of excess adhesive ADH is larger than shown in FIG. 1C.

Now, referring to FIG. 2, a further embodiment of the invention is illustrated. As shown in FIG. 2, the electrically conductive layer ECL, not the electrode ELEC1, has been roughened to create peaks or other types of surface structures STR establishing electrical connection between the first electrode ELEC1 and the electrically conductive layer ECL.

Now, referring to FIG. 3, a further embodiment of the invention is illustrated. As shown in FIG. 3, both the electrically conductive layer ECL and the first electrode ELEC1 have been roughened to create surface structures STR establishing electrical connection between the first electrode ELEC1 and the electrically conductive layer ECL. In this context it should be understood that the roughening of the electrically conductive layer ECL and the roughening of the first electrode ELEC1 may be performed by the same technique, or by different techniques, depending on the specific situation and circumstances.

The method of bonding embodiments illustrated on FIGS. 2 and 3 may be performed in accordance with the embodiment illustrated on FIGS. 1A-C. Only, as an alternative or in addition to roughening the first electrode ELEC1, the electrically conductive layer ECL is roughened.

For example, similar to the embodiment of FIGS. 1A-C, an adhesive ADH may be applied to the electrically conductive layer ECL and/or to the first electrode ELEC1.

Furthermore, the principle illustrated for a piezoelectric ultrasonic transducer UT on FIGS. 1A-C, FIGS. 2 and/or 3 may in some embodiments apply for other types of electronic components EC.

The support substrate SS and the electrically conductive layer ECL thereon illustrated on FIGS. 1A-C and FIGS. 2 and 3 may be substantially flat and smooth, i.e. without any curvature or surface structure, before the roughening.

Now referring to FIGS. 4 and 5, further embodiments of the invention is illustrated. On both FIGS. 4 and 5, the electronic component EC comprises two electrodes ELEC, illustrated to the right and left, respectively. In both FIGS. 4 and 5 the electrodes ELEC are bonded an electrically conductive layer ECL of the support substrate SS.

For both embodiments, the electrically conductive layer ECL for the left electrode ELEC and the electrically conductive layer ECL for the right electrode ELEC are separated, as illustrated, and electrically insulated from each other to avoid short circuiting. The electrical insulation e.g. may be facilitated by the support substrate SS being electrically insulating or by the two electrically conductive layers ECL being attached to separate support substrates SS.

Figure 6:
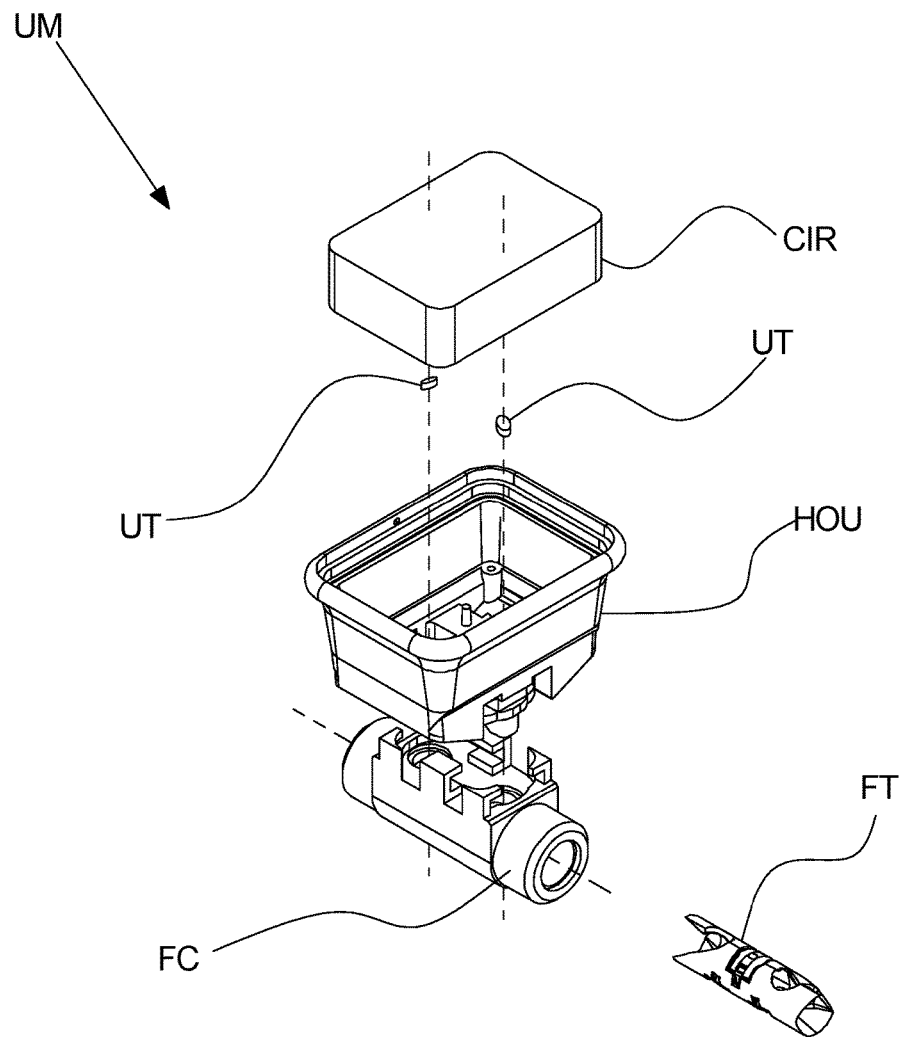
FIG. 6 illustrates an ultrasonic flow meter UM in an exploded perspective view according to an embodiment of the invention.

Now, referring to FIG. 6 an ultrasonic flow meter UM is shown according to an embodiment of the invention. The ultrasonic flow meter UM is shown in an exploded view.

The ultrasonic flow meter UM comprises a housing HOU, a flow conduit FC, a flow tube FT, two ultrasonic transducers UT. The ultrasonic flow meter UM may comprise further components, such as e.g. a display for displaying consumption data and/or other relevant data, such as information relating to the operation status. The electronic circuit CIR may comprise an antenna and electronic components allowing the ultrasonic flow meter UM to transmit and/or receive data, for example to transmit consumption data to an external receiver.

The housing HOU may be assembled on the flow conduit FC in different ways, e.g. by means of locking pins (not shown) or other suitable methods. The flow tube FT may be inserted into the flow conduit where it may be fixated.

The flow tube FT may comprise ultrasonic reflector (not shown) for reflecting an ultrasound signal transmitted by one of the two ultrasonic transducers UT onto the other ultrasonic transducer UT and vice versa, i.e. whereby the ultrasonic reflectors establishes a path for the ultrasound signal from one of the two ultrasonic transducers UT to the other ultrasonic transducer UT, and vice versa.

In some embodiments the ultrasonic flow meter UM may not comprise a flow tube FT. In such embodiments, the ultrasonic reflectors (not shown) should be provided in other ways, or the flow conduit FC or another insert therein should function as an ultrasonic reflector, i.e. reflecting the ultrasound signal.

The ultrasonic transducers UT are bonded to an electrically conductive layer (not shown) on part of the inside of the housing HOU. One way this can be performed is illustrated on FIGS. 7A-B.

Figure 7A:
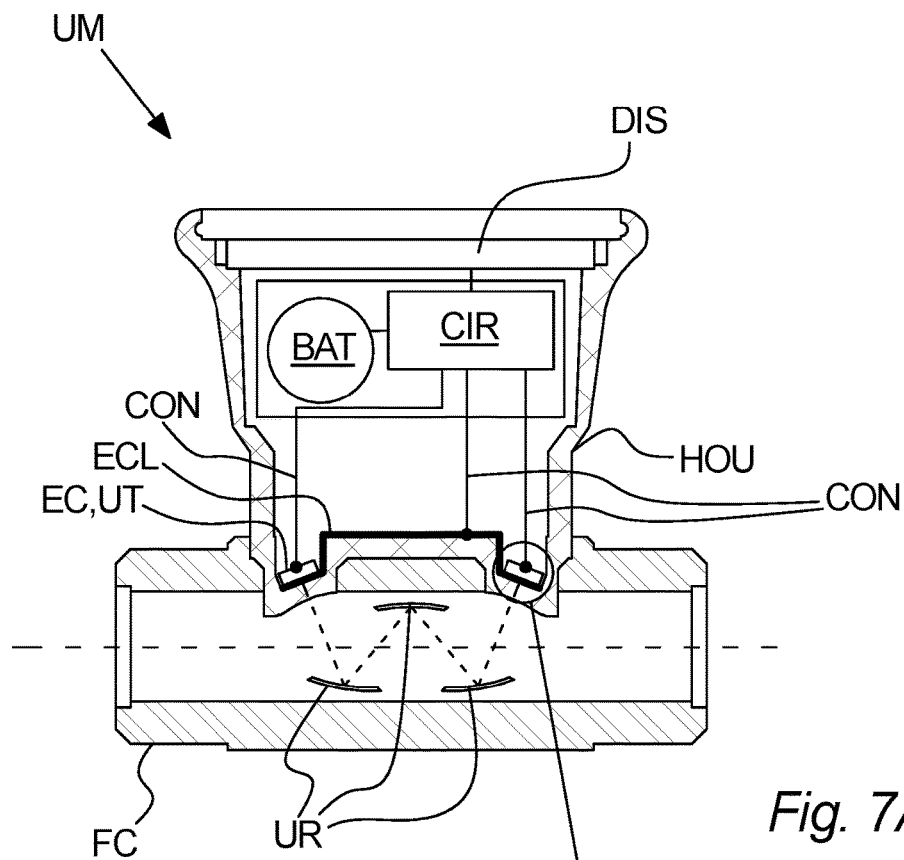
FIGS. 7A-B illustrate an ultrasonic flow meter UM in a cross-sectional side view and an exploded view of the fixation of one of the ultrasonic transducers according to an embodiment of the invention.
Figure 7B:
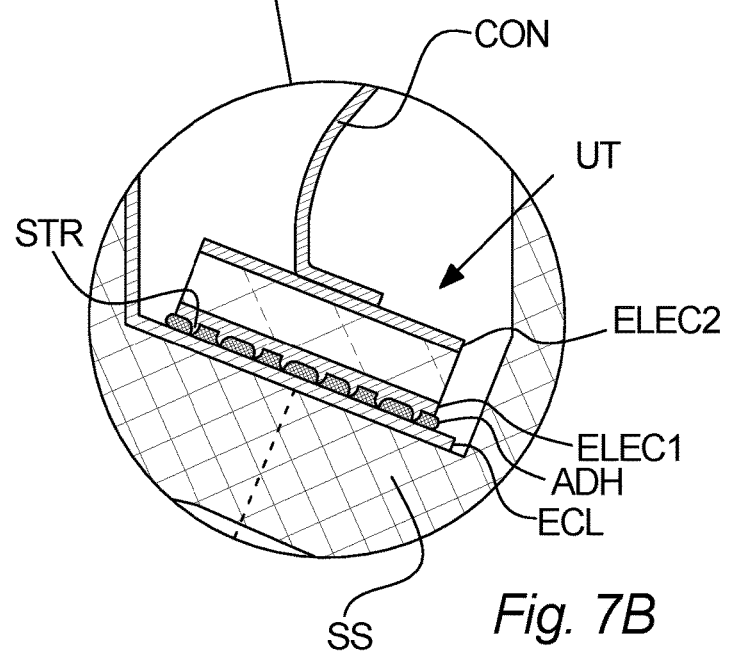

Now referring to FIGS. 7A-B, an ultrasonic flow meter UM according to an embodiment of the invention is illustrated. The ultrasonic flow meter UM may be similar to the ultrasonic flow meter UM described in relation with FIG. 6.

As illustrated in FIG. 7A, the ultrasonic flow meter UM comprises ultrasonic reflectors UR for establishing a path for the ultrasound from one ultrasonic transducer UT to the other via the ultrasonic reflectors UR (the path is shown as the dashed line. In FIG. 7A, the ultrasonic flow meter UM comprises three ultrasonic reflectors UR. In alternative embodiments, the ultrasonic flow meter UM may comprise only a single ultrasonic reflector UR, two ultrasonic reflectors UR, or even three or more ultrasonic reflectors UR, such as four or five ultrasonic reflectors UR.

Also illustrated is that the ultrasonic flow meter UM comprises a battery BAT for powering the ultrasonic flow meter UM including its components, such as the electronic circuit CIR and the ultrasonic transducers UT. Other power sources may be used as an alternative to or in combination with batteries, such other power sources comprising e.g. solar cells, power grid, etc.

The electronic circuit CIR is a control circuit adapted to control the ultrasonic flow meter UM, including the transmission and reception of ultrasound signal by the ultrasonic transducers UT, and the display DIS and any communication to external receivers.

The ultrasonic flow meter UM further comprises a display DIS for displaying consumption data and/or other relevant data, such as information relating to the operation status.

The ultrasonic flow meter UM may be of the transit time type flow meter measuring the difference between the transit time of the ultrasound from one ultrasonic transducer to the other ultrasonic transducer and vice versa.

The electrodes of the ultrasonic transducer UT are separately connected to the electronic circuit CIR.

On FIG. 7B the fixation of one of the ultrasonic transducers UT is illustrated in more detail. The electronic transducer UT comprises a first and electrode ELEC1 facing downwards and a second electrode ELEC2 facing upwards. As seen, the surface of the first electrode ELEC1 is shown as with a roughened surface. Thus, the first electrode ELEC1 of the ultrasonic transducer UT may be bonded to the electrically conductive layer ECL of the support substrate SS in a similar way to the illustrated embodiments of FIGS. 1A-C or any of the alternative embodiments illustrated on FIGS. 2-3.

The first electrode ELEC1 shown as the bottom electrode on FIG. 7B is connected to the electronic circuit CIR via the electrically conductive layer ECL and via an electrical connector CON. The second electrode ELEC2 shown as the upper electrode in FIG. 7B is connected to the electronic circuit CIR via a further electronic connected CON, which may comprise a spring connector. As shown in FIG. 7A, bottom electrodes (not shown) of the two ultrasonic transducers UT shown in FIG. 7A are connected to the electronic circuit CIR via a common electrically conductive layer ECL and a common electrical connector CON. In certain alternative embodiments separate electrically conductive layers ECL and electrical connectors CON may be utilized.

It should be noted, though, that not all dimensions, if any, shown in FIGS. 1-7 are drawn to scale, but that some dimensions are enlarge or decreased for illustrative purposes. For example the thickness of the electrically conductive layer ECL, the thickness of the adhesive ADH, the thickness of the electrodes ELEC1, ELEC2, and the size of the structures STR are for most embodiments enlarged relative to actual dimensions.

Figure 8A:
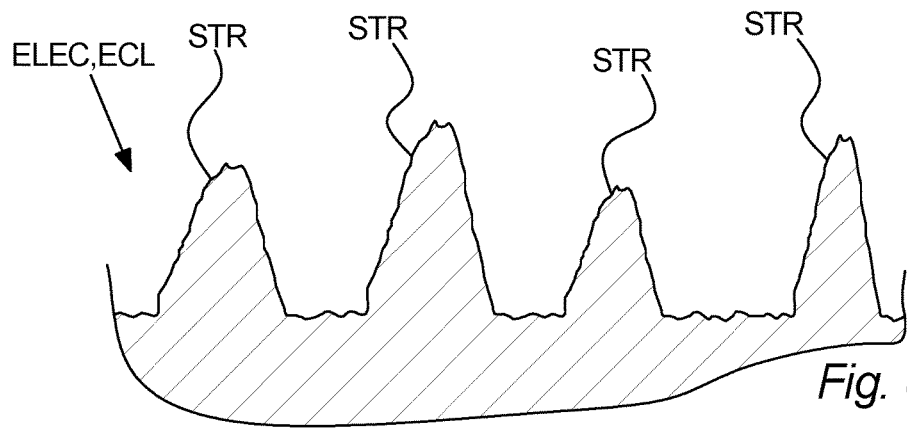
FIGS. 8A-C illustrate surfaces of an electrode ELEC or an electrically conductive layer ECL according to different embodiments of the invention.
Figure 8B:
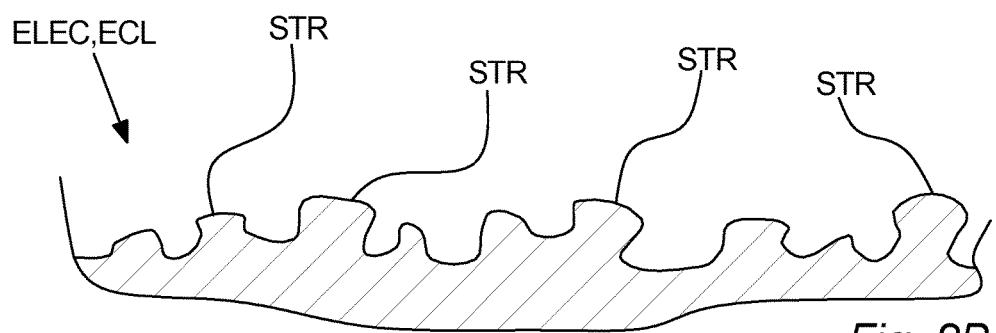
Figure 8C:
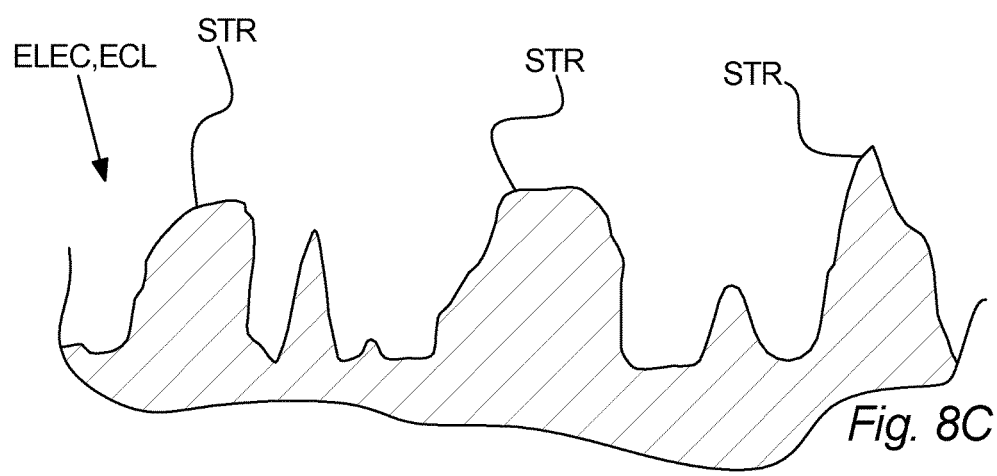

Referring to FIGS. 8A-C, illustrations of cross-sectional side view profiles of surfaces of an electrode ELEC or an electrically conductive layer ECL with surface structures STR created by roughening is shown according to different embodiments of the invention.

FIG. 8A shows a number of surface structures STR extending from the surface of the electrode ELEC or electrically conductive layer ECL. In some embodiments, the surface structures STR may for example be line-formed structures, e.g. similar to what is illustrated on FIG. 9A. In other embodiments, the surface structures STR may be peaks having cone-like or frustrated cone-like shapes, e.g. similar to those illustrated on FIG. 9B.

FIG. 8B shows a number of surface structures STR extending from the surface of the electrode ELEC or electrically conductive layer ECL. In some embodiments the surface structures STR may form lines, whereas in other embodiments the surface structures STR have statistically similar cross-sections in all direction. The latter may for example be made using the technique electronic discharge machining, EDM.

FIG. 8C shows a number of surface structures STR extending from the surface of the electrode ELEC or electrically conductive layer ECL. In some embodiments the surface structures STR may form lines, whereas in other embodiments the surface structures STR have statistically similar cross-sections in all direction.

Figure 9A:
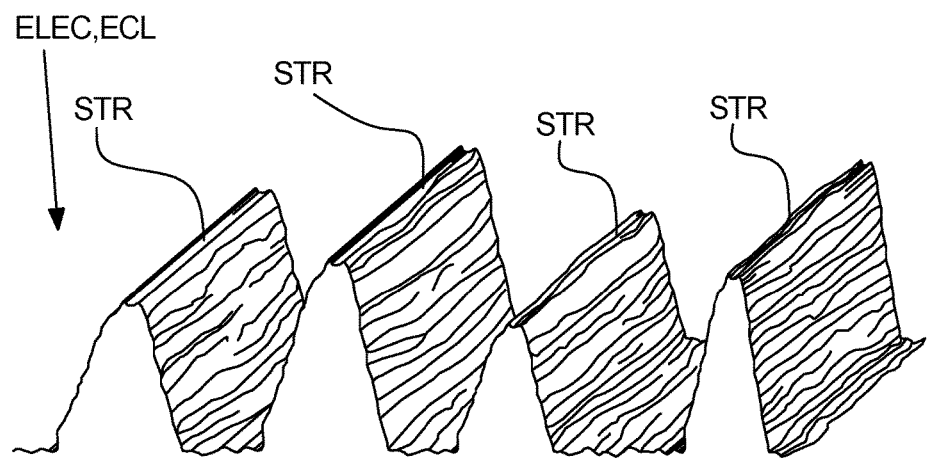
FIGS. 9A-B illustrate surfaces of an electrode ELEC or an electrically conductive layer ECL according to different embodiments of the invention.

Now referring to FIG. 9A, an illustration of a surface of an electrode ELEC with surface structures STR created by roughening is shown in a perspective view according to an embodiment of the invention. The surface structures STR on FIG. 9A are formed as lines on the surface of the electrode ELEC, i.e. as linear or near-linear formed elevations on the surface of the electrode ELEC. It should be emphasized that FIG. 9A is for illustrative purposes only and that the dimensions therefore not necessarily are realistic. For example, in some embodiments the ratio between the average dimension of the surface structure (e.g. the average height) and the average spacing between the surface structures may be different compared to what is shown on FIG. 9A.

Figure 9B:
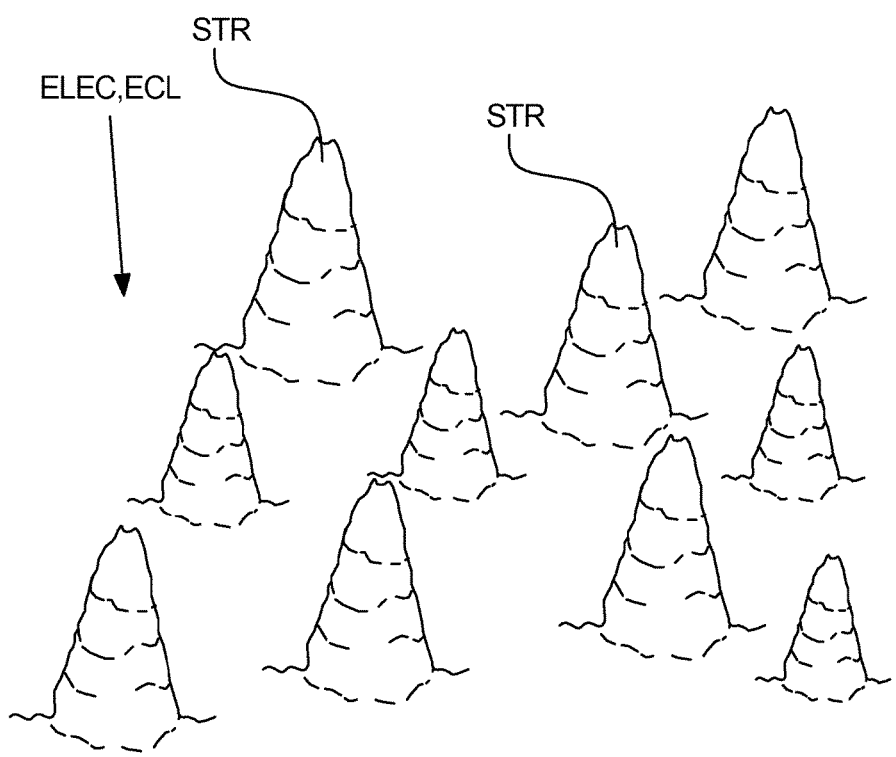

Referring to FIG. 9B, an illustration of a surface of an electrode ELEC with surface structures STR created by roughening is shown in a perspective view according to an embodiment of the invention. The surface structures STR on FIG. 9B are formed as cones on the surface of the electrode ELEC, i.e. as point-formed cone-shaped elevations on the surface of the electrode ELEC. It should be emphasized that FIG. 9B is for illustrative purposes only and that the dimensions therefore not necessarily are realistic. For example, in some embodiments the ratio between the average dimension of the surface structure (e.g. the average height) and the average spacing between the surface structures may be different compared to what is shown on FIG. 9B.

Figure 10A:
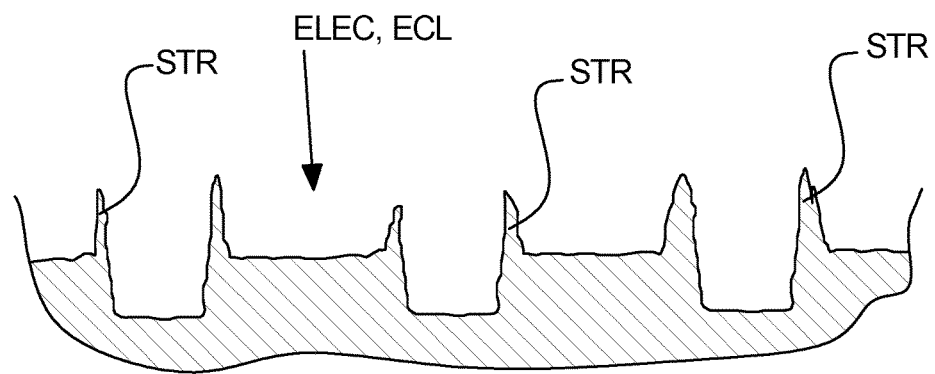
FIGS. 10A-B illustrate a surface of an electrode ELEC or an electrically conductive layer ECL according to an embodiment of the invention.
Figure 10B:
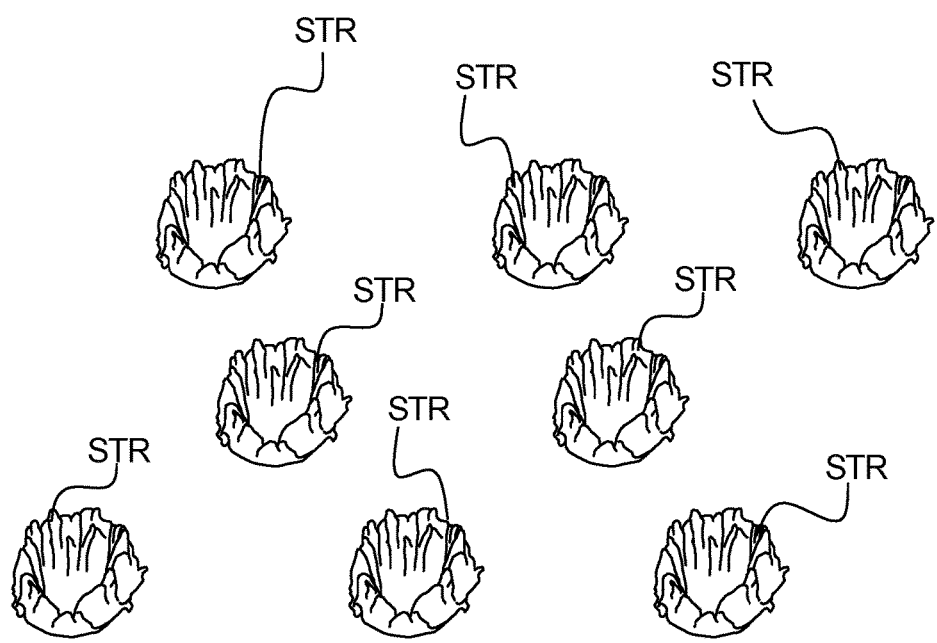

Turning to FIGS. 10A and 10B a further example of surface structures STR established by means of roughening a surface of an electrode ELEC or an electrically conductive layer ECL is shown according to an embodiment of the invention. FIG. 10A shows a cross-sectional side view of a surface of an electrode ELEC or an electrically conductive layer ECL, whereas FIG. 10B shows a perspective view of the same.

The surface structures STR shown in FIGS. 10A and 10B may be an example of surface structures which may be made by means of laser machining, such as machining by continuous or pulsed lasers. Especially the use of pulsed lasers with pulse lengths in the nanosecond range or longer may be applicable.

Figure 11A:
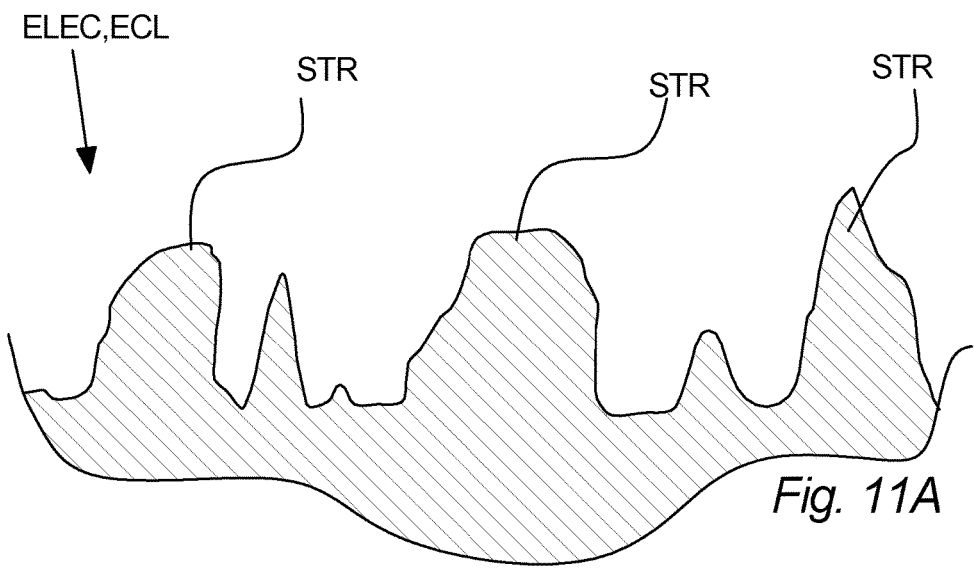
FIGS. 11A-B illustrate a surface of an electrode ELEC or an electrically conductive layer ECL according to an embodiment of the invention.
Figure 11B:
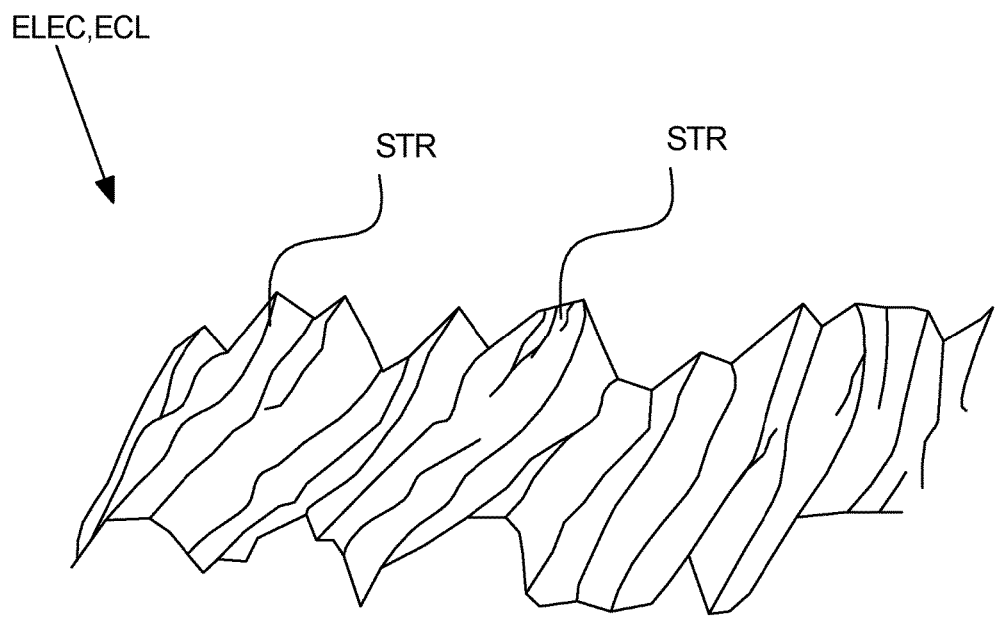

On FIGS. 11A and 11B another example of surface structures STR established by means of roughening a surface of an electrode ELEC or an electrically conductive layer ECL is shown according to an embodiment of the invention. FIG. 11A shows a cross-sectional side view of a surface of an electrode ELEC or an electrically conductive layer ECL, whereas FIG. 11B shows a perspective view of the same.

The surface structures STR shown in FIGS. 11A and 11B may for example be an example of surface structures which may be made by means of abrasion by sandpaper or by a pointed or sharp object, such as a diamond-tipped object.

Figure 12:
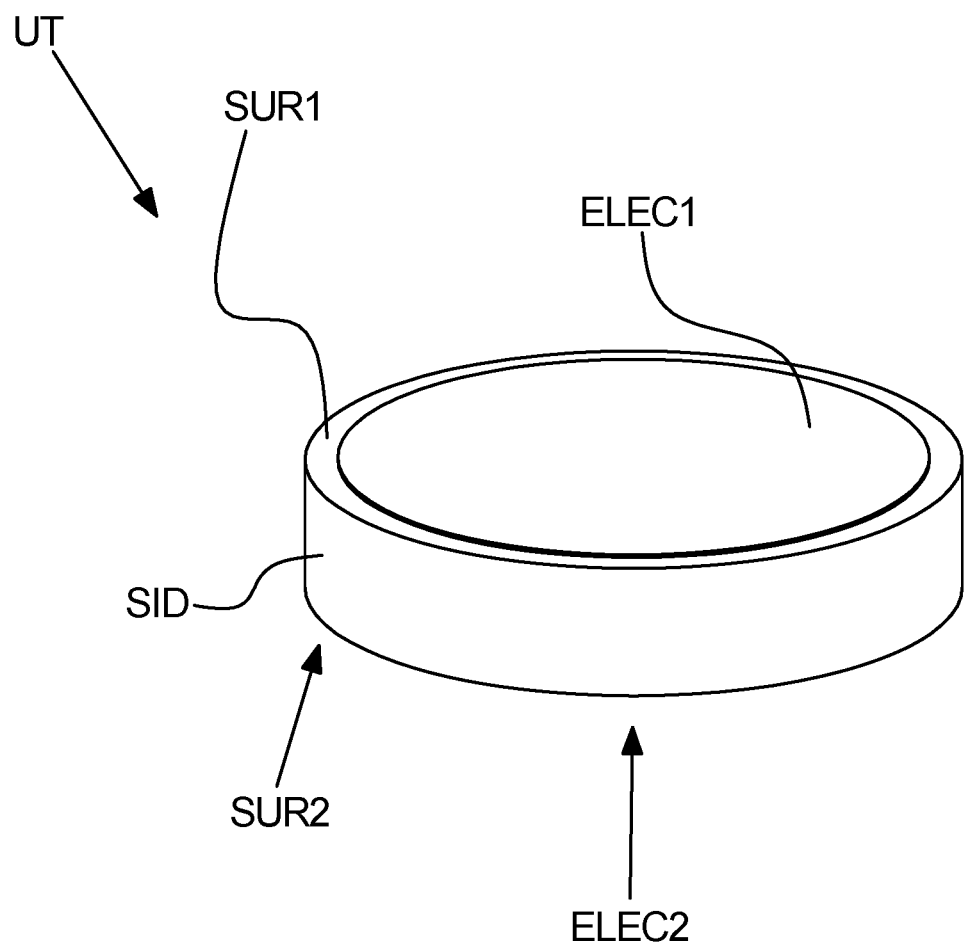
FIG. 12 illustrates a piezoelectric ultrasonic transducer UT according to an embodiment of the invention.

Now, referring to FIG. 12, a piezoelectric ultrasonic transducer UT according to an embodiment of the invention is illustrated.

The piezoelectric ultrasonic transducer UT comprises a piezoelectric disk having a first and a second surface SUR1, SUR2, the first and second surfaces SUR1, SUR2 being opposite and substantially flat. The surfaces SUR1, SUR2 are connected by a single curved side SID, whereby the two surfaces SUR1, SUR2 and the side SID together forms the outer surface of the piezoelectric disk.

A first electrode ELEC1 has been applied to a part of the first surface SUR1, thus leaving a narrow band of the first surfaces SUR1 exposed and uncovered by the first electrode ELEC1. In some embodiments the first electrode may cover all of the first surfaces SUR1.

Similarly, second electrode ELEC2 has been applied to a part of the second surface SUR2. The second electrode ELEC2 may cover part of or all of the second surfaces SUR2, similar to what is described for the first electrode ELEC1.

It is noted that the first electrode ELEC1 and the second ELEC2 of the ultrasonic transducer UT illustrated in FIG. 12 are substantially similar, and that the ultrasonic transducer UT therefore may be used with the first electrode bonded to the electrically conductive layer ECL as illustrated on previous figures, or with the second electrode ELEC2 bonded to the electrically conductive layer ELC.

LIST OF FIGURE REFERENCES

ELEC. Electrode
ELEC1. First electrode
ELEC2. Second electrode
EC. Electronic component
ECL. Electrically conductive layer
SS. Support substrate
CON. Electrical connector
ADH. Adhesive
UM. Ultrasonic flow meter
UT. Piezoelectric ultrasonic transducer
HOU. Housing
CIR. Electronic circuit
FT. Flow tube
DIS. Display
BAT. Battery
FC. Flow conduit
UR. Ultrasonic reflector
STR. Surface structure
SUR. Surface
SURi. i'th surface
SID. Side

What is claimed is:

1. An ultrasonic flow meter comprising:
   two piezoelectric ultrasonic transducers each comprising a first and a second electrode;
   an ultrasonic flow meter housing, at least a part of which forms a support substrate for supporting said two piezoelectric ultrasonic transducers on an electrically conductive layer of the support substrate;
   an adhesive applied between said electrically conductive layer and said first electrode;
   wherein at least said first electrode of each piezoelectric ultrasonic transducer has a roughened surface,
   wherein electrical connection between the electrically conductive layer and said first electrode is formed by said roughening, and
   wherein said roughening increases contact area of at least said first electrode.

2. An assembly of a support substrate and a piezoelectric ultrasonic transducer, the assembly comprising:
   the support substrate having an electrically conductive layer;
   the piezoelectric ultrasonic transducer having an electrode; and an adhesive applied between said electrically conductive layer and said electrode;

wherein at least said electrode has a roughened surface, wherein electrical connection between the electrically conductive layer and said electrode is formed by said roughening, and wherein said roughening increases contact area of at least said first electrode.

3. The assembly according to claim 2, wherein said assembly forms part of an ultrasonic flow meter, the support substrate forming one or more support surfaces for one or more piezoelectric ultrasonic transducers; said electrode comprising a first electrode of said piezoelectric ultrasonic transducers.

4. The assembly according to claim 2, wherein one or both of the electrode and the electrically conductive layer has a surface being substantially flat.

5. The assembly according to claim 2, wherein the adhesive is an electrically non-conductive adhesive.

6. The assembly according to claim 2, wherein the adhesive contains less than 10% by volume of electrically conductive particles.

7. The assembly according to claim 2, wherein the adhesive is curable at ambient temperatures between 10° C. and 80° C.

8. The assembly according to claim 2, wherein the support substrate is formed by a non-conductive material.

9. The assembly according to claim 2, wherein the support substrate forms part of an ultrasonic transducer housing.

10. The assembly according to claim 2, wherein said electrode is a first electrode and said piezoelectric ultrasonic transducer further comprises a second electrode.

11. The assembly according to claim 10, wherein said first and second electrodes are located on opposite sides of said piezoelectric ultrasonic transducer, wherein said piezoelectric ultrasonic transducer comprises a first and a second surface, the first and second surfaces being opposite and substantially flat, the first and second surfaces being connected via one or more sides, wherein said first electrode extends over a part of or all of the first surface, and wherein said first electrode does not extend onto said second surface.

12. The assembly according to claim 2, wherein said assembly forms part of an ultrasonic flow meter, the support substrate forming one or more support surfaces for one or more piezoelectric ultrasonic transducers; said electrode comprising a first electrode of said piezoelectric ultrasonic transducers.

* * * * *